United States Patent
Kowkutla et al.

(10) Patent No.: US 7,071,752 B2
(45) Date of Patent: Jul. 4, 2006

(54) AMPLIFIERS

(75) Inventors: Venkateswar R. Kowkutla, Plano, TX (US); Shifeng Zhao, Dallas, TX (US); Luis E. Ossa, Plano, TX (US); Kenneth M. Bell, Windom, TX (US); Anker Josefsen, Gentofte (DK); Lars Risbo, Copenhagen (DK)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/768,365

(22) Filed: Jan. 29, 2004

(65) Prior Publication Data

US 2004/0239417 A1    Dec. 2, 2004

Related U.S. Application Data

(62) Division of application No. 09/945,027, filed on Aug. 31, 2001.

(51) Int. Cl.
    *G06F 1/04*    (2006.01)

(52) U.S. Cl. .................................... 327/291; 327/299
(58) Field of Classification Search .................. 330/10, 330/207 A, 251, 146, 268, 55, 118; 327/299, 327/291, 18, 20
See application file for complete search history.

(56) References Cited

U.S. PATENT DOCUMENTS

| | | | | |
|---|---|---|---|---|
| 6,078,214 A * | 6/2000 | Zhang | ............................ | 330/10 |
| 6,198,689 B1 * | 3/2001 | Yamazaki et al. | ............ | 365/233 |
| 6,215,726 B1 * | 4/2001 | Kubo | ............................ | 365/233 |
| 6,823,025 B1 * | 11/2004 | Lee et al. | ...................... | 375/320 |

* cited by examiner

*Primary Examiner*—Henry Choe
(74) *Attorney, Agent, or Firm*—W. James Brady, III; Frederick J. Telecky, Jr.

(57) ABSTRACT

A digital amplifier includes a noise shaper and a dither generator arranged to introduce noise to the shaper. The generator uses a seed value derived from a state variable of the shaper.

4 Claims, 8 Drawing Sheets

AMPLIFIERS

This application claims priority under 35 USC § 120 of application Ser. No. 09/945,027, filed Aug. 31, 2001. This application is a divisional of the above mentioned application.

The present invention, inventive concepts and patent application relate to amplifiers and amplification and in particular to digital amplification based on Pulse Width Modulation (PWM) techniques.

Amplifier implementation and design is an area that has engaged much analytical and engineering effort. For example, there are many aspects of the PWM approach which must work together to make a successful amplifier. Some of these aspects are addressed herein and solutions provided to problems inherent in amplification itself.

Figures 1, 2:
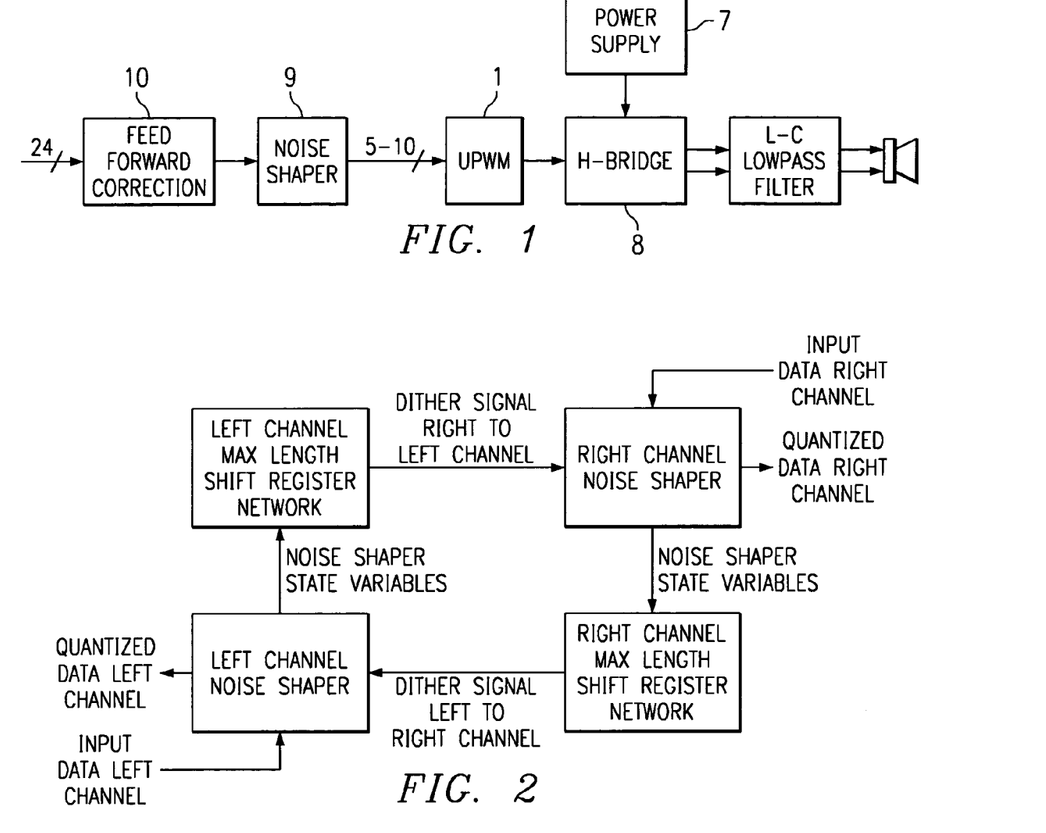

A digital amplifier is shown in FIG. 1. A PCM to PWM conversion circuit (in this example comprising a feed forward correction circuit 10, noise shaper 9 and a Uniform Pulse Width Modulator (UPWM) 1). The noise shaper 9 produces a noise-shaped output signal with reduced bit resolution (e.g. 5–10 bits). The UPWM modulator 1 produces a set of control signals that controls a set of switches in a switching output stage (shown as H-bridge 8) being connected to a power supply circuit 7, thereby allowing audio information in the form of electrical energy to be transferred to a load, shown here as a loudspeaker preceded by a passive L-C low pass filter consisting of two inductors and two capacitors.

The switches in the H-bridge transfer power directly from a power supply 7 to the load. This means that if distortion is to be obviated, then the power supply must be very accurate, which will normally require relatively expensive components which incorporate large capacitors and inductors or costly active regulation circuits.

A more detailed description of the amplifier and improvements thereto may be found in PCT Patent Application PCT/DK00/00048.

The noise shaper of such an amplifier is included to reduce quantization noise within the system, for example by introducing spectrally shaped noise such that noise in a range of interest (e.g. the audio range) is suppressed at the expense of an increased amount of out of band noise (for example ultrasonic noise). A fuller discussion of this topic, together with implementations and improvements thereto is to be found in PCT Patent Application PCT/DK97/00133.

The present invention in one aspect thereof provides an improved noise shaping technique by deriving introduced noise in a new way and in particular by providing a dither generator for use for this purpose. The dither generator may seed or introduce noise, shaped or unshaped to the noise shaper.

The general arrangement of an improved approach incorporating dither generation is shown in FIG. 2.

An embodiment of the invention will now be described by way of example.

Figure 3:
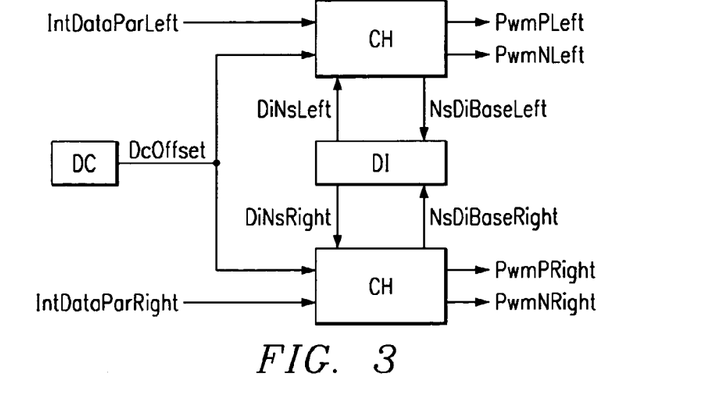

The data flow in the modulator (for example modulator 1 of FIG. 1) is shown in FIG. 3, wherein the identified signals are as follows:

| | |
|---|---|
| IntDataParLeft | Data from the left channel interpolation filter to the modulator. Format is 24 bits two compliment parallel. |
| IntDataParRight | Data from the right channel interpolation filter. |
| PwmPLeft | PWM output for the positive leg of the right channel half-bridge. |
| PwmNLeft | PWM output for the negative leg of the right channel half-bridge. |
| PwmPRight | PWM output for the positive leg of the left channel half-bridge. |
| PwmNRight | PWM output for the negative leg of the left channel half-bridge. |

The PWM modulator contains two channels, left and right. Data from the left and right interpolation filters is respectively fed into the input of the left and right channel modulators. In addition the modulator contains two entities shared by the channels, the dither generator and the DC offset generator.

Figure 4:
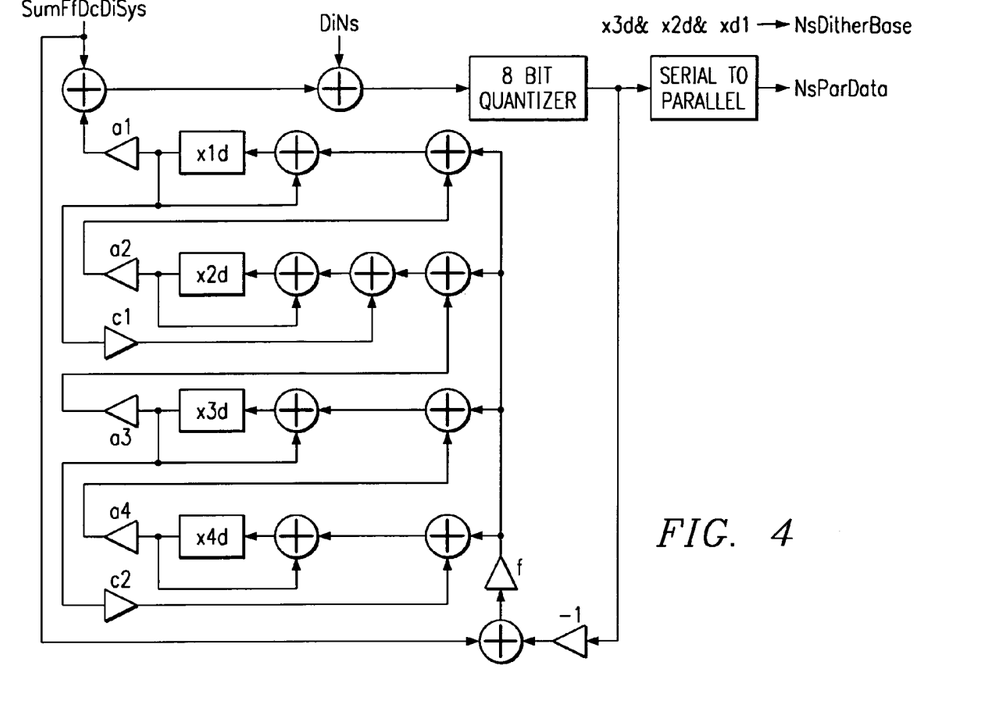

The noise shaper itself is shown in FIG. 4, in which the identified signals are as follows:

| | |
|---|---|
| SumFfDcDiSys | Data into the noise shaper |
| NsParData | Data to the PWM generator |
| NsDitherBase | 3 bits signal taken from the LSB's of the noise shaper state variables. These signals are used as seed in the dither generator. |
| DiNs | Dither Signal |

The noise shaper converts the input PCM signal in a high-resolution format (24 bits, for example) into a lower resolution PCM signal (e.g. 8 bits). By using truncation-error feedback, the quantization error is spectrally redistributed to the ultra-sonic range. In the embodiment, the noise shaper uses a $4^{th}$-order feedback filter topology that may be optimized for simple hardware implementation. The topology consists of 4 cascaded integrators with a scaling stage and a feedback signal input for each integrator. Furthermore, two local feedback paths are provided around the integrators in order to introduce two sets of complex zeros in the noise transfer function. In accordance with an aspect of the present invention, dither is added prior to the quantizer, i.e. inside the noise shaper feedback loop.

In the present embodiment, a dither generator exploits the property of a noise shaper, that it is processing quantization errors, which have a random property caused by the non-linearity (i.e. the quantization) in the noise shaper. The state variable from the noise shaper is fed into a maximum length shift register network for additional randomization. The benefit of this topology is, that if the state variables of the noise shaper is represented in N bits all together, and the number of bits in the maximum length shift register network is S bits, then the resulting dither generator will consist of N+S bits.

Furthermore, in a multichannel system with M channels, the dither signal generated in channel I, $1<=I<M$, is fed into the noise shaper in the channel I+1, and the dither signal from channel M is fed into channel 1. The dither signal fed into a noise shaper is used to randomize the activity in the noise shaper, for example by adding it to the signal just prior the quantizer inside the noise shapers feedback loop. Therefore, with the described configuration, in a M channel system the resulting dither generator will consist of M*(N+S) bits.

In a stereo system (M=2), noise derived from the right channel may be used to seed the left channel.

The length of the limit cycle that a dither generator produces is limited by the number of bits in the implementation. Therefore, in a multichannel system with M channels, with N bits per noise shaper and S bits per shift register network, a dither generator taking advantage of the noise shaper state variables consisting of M*(N+S) bits has an advantage compared with a maximum length shift register implementation only consisting of M*S bits. When a dither generator in accordance with the present invention is compared with prior art chaotic noise shapers, it is seen that the limit cycles in the chaotic noise shaper is limited by the N bits in the noise shaper, while the limit cycles in the dither generator taking advantage of the noise shaper state variables is limited by M*(N+S) bits.

Figure 5:
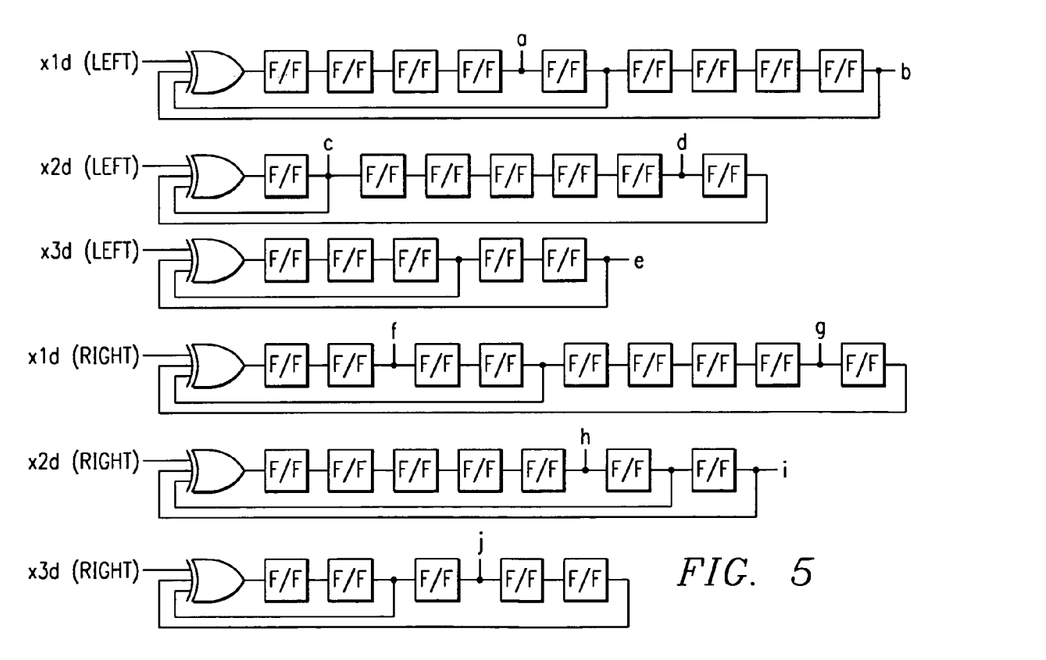

A dither generator suitable for use in the present embodiment is shown in FIG. 5.

The dither generator uses output from the state variables in the noise shaper to generate four different dither signals. For each channel a dither signal is added inside the noise shaper feedback loop.

The input from 3 noise shaper state variables in one channel are fed into the loop of 3 maximum length shift registers. From these 3 shift-registers 5 outputs are taken and exclusive or'ed resulting in two 24-bit dither signals. One of these dither signals is remained to 16 bit to get the dither signal for the noise shaper.

Figure 6:
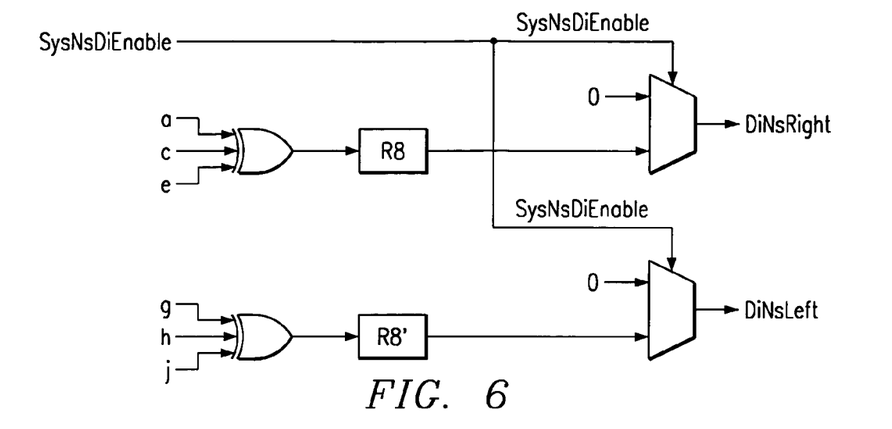

The noise shaper dither arrangement is shown in FIG. 6, wherein the identified signals are as follows:

| | |
|---|---|
| NsDitherBaseLeft | 3 signals in 24 bit serial format used at seed for the dither generator for the Right channel. |
| NsDitherBaseRight | 3 signals in 24 bit serial format used at seed for the dither generator for the Left channel. |
| SysNsDiEnable | Enable dither for the Noise Shapers. Noise shaper dither is enabled when SysNsDiEnable="1". Noise Shaper dither should be enabled by default. |
| DiNsLeft | Dither signal to the noise shaper in left channel. |
| DiNsRight | Dither signal to the noise shaper in Right channel. |

Note that NsDitherBaseLeft=xd3 (left) & xd2 (left) & xd1 (left), and NsDitherBaseRight=xd3 (right) & xd2 (right) & xd1 (right) (as shown in FIG. 4).

Figure 7:
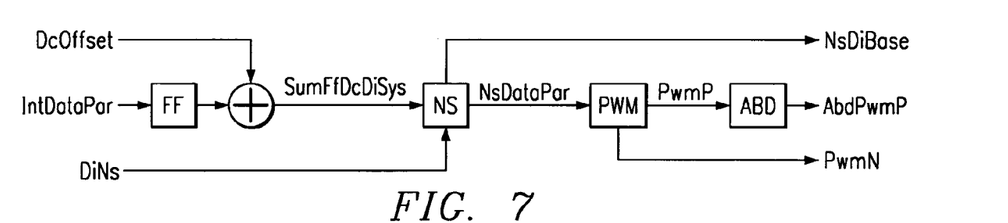

An exemplary channel arrangement (for example one of the Channels CH of FIG. 3) is shown in FIG. 7, wherein the identified signals are as follows:

| | | |
|---|---|---|
| IntDataPar | | Data from the left channel interpolation filter to the modulator. Format is 24 bits two compliment parallel. |
| DiNs | | Dither signal 24 bits bit-serial representation to be added into the noise shaper. |
| DcOffset | | DC offset 24 bits bit-serial representation to be added to the signal. |
| PwmPLeft | O | PWM output for the positive leg of this channel half-bridge. |
| PwmNLeft | O | PWM output for the negative leg of this channel half-bridge. |
| NsDitherBase | O | 3 signals used as seed for the dither generator for the opposite channel. |

The channel module shown constitutes one mono channel. Data from the interpolation filter is sent to the feed forward corrector for addition of anti distortion. A DC offset can be added to the output from the feed forward corrector, before the signal is fed into the noise shaper. The noise shaper delivers quantized data to the PWM generator, where the PWM signals for the positive and negative H-bridge leg is generated. Finally the PWM signal to the positive H-bridge leg is delayed in the ABD-delay entity according to the ABD distortion minimization scheme.

The dither for the noise shaper (DiNs) is fed into the noise shaper entity, where it is added inside the feedback loop of the noise shaper. The signal NsDiBase is generated in the noise shaper, to be used as a seed in the dither generator.

A dither generator in accordance with the present invention may be configured to output a random white spectrum signal, useful for relieving the following kind of problems and their resultant artifacts: Suppression of noise shaper tones, averaging truncation errors, and breaking up systematic truncation errors.

A potentially cost effective method of reducing crossover distortion and noise in an amplifier by implementing a programmable delay between the inverting or non-inverting sides of the class ABD modulation scheme.

In switching Class-D amplifiers, the switching of the half-bridges generate noise. Half-bridges are especially sensitive to noise when they are shifting, and without a programmable ABD and Inter-channel delay, the simultaneous shifting of half-bridges will occur when the noise is most easily perceived—i.e. when a low-level signal is input to the system. In accordance with an aspect of the present invention a Programmable ABD and inter-channel delays are used to correct for the above problems with much improvement. An optimum delay value may be found to achieve the highest system performance. A System having a programmable ABD and Inter-channel delay in a class-D amplifier also provides good noise floor and high performance that is less sensitive to speaker load with very low complexity and with very high cost effectiveness without compromising the amplifier specifications.

The invention provides a programmability option for the ABD delay and the inter-channel delay. Different delay values can be programmed for the ABD and inter-channel delay to optimize the class-D system to provide best results. Previous solutions involved using fixed delays for the same purpose. This may not provide the best results as there are many variables on the class-D system which effects noise and system performance and the fixed delay may not suffice to give the best possible results. Having a programmable option allows optimization for these variables to provide the best delay value for the highest system performance.

The invention can be contrasted with other systems involving the use of a strong negative feedback, which is not easily programmable. Such an approach is quite difficult to implement since negative feedback is performed prior to the low-pass filter which adds more noise to the system. There is a fundamental difference in the approach of the present invention compared with the feedback approach. In this invention the problem is corrected at the source in contrast to a feedback solution which tries to correct the error at the output after it occurs. This new system provides a choice of ABD and inter-channel delay values needed to tune the system to provide the best results, easy to implement, cost effective, less sensitive to the speaker load variations, provides better controllability and repeatability of the delay values and provides better overall system performance.

An ABD Modulation scheme is described in PCT Patent Application number PCT/DK99/00418.

In accordance with an aspect of the present invention, a programmable ABD is provided by using a register to accurately control the ABD delay. The programmability option can be used to tune the system amplifier to achieve high performance that is universal to any type of speaker load with very low complexity and at a very low cost without compromising the amplifier specifications.

Figure 8:
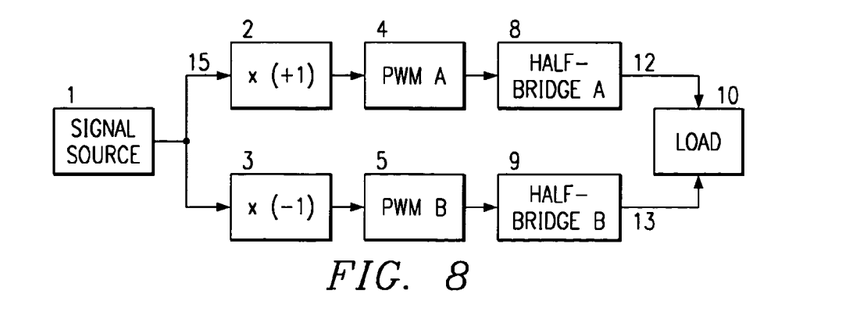

FIG. 8 illustrates a class BD modulation scheme that is described in more detail in the patent application referred to above. This scheme has an inverted and non-inverted legs (A & B respectively) making use of all the advantages of a differential coupling.

Figure 9:
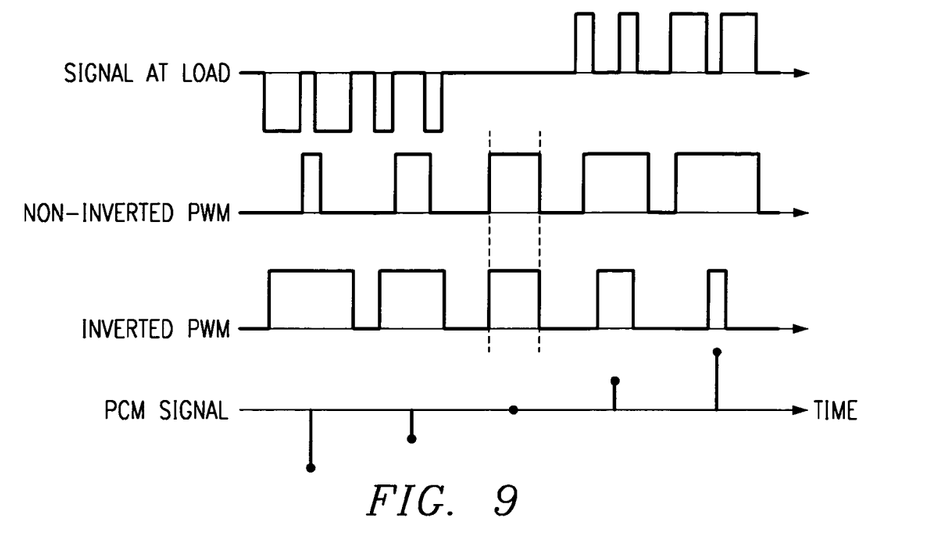
Figure 10:
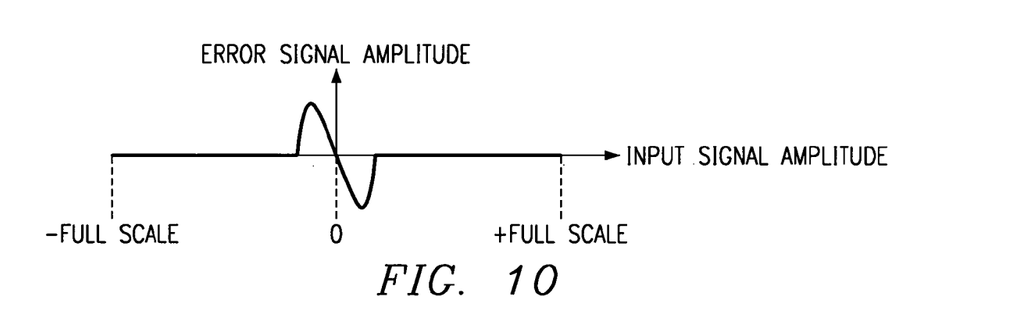

Though the class BD modulation techniques offer a number of advantages, i.e., many noise contributions are cancelled by the differential operation and the even-ordered non-linearity are generally cancelled, it can suffer from cross-over distortion and higher noise around the zero-transition of the input signal. FIGS. 9 and 10 show the class BD waveforms and errors respectively.

Figure 11:
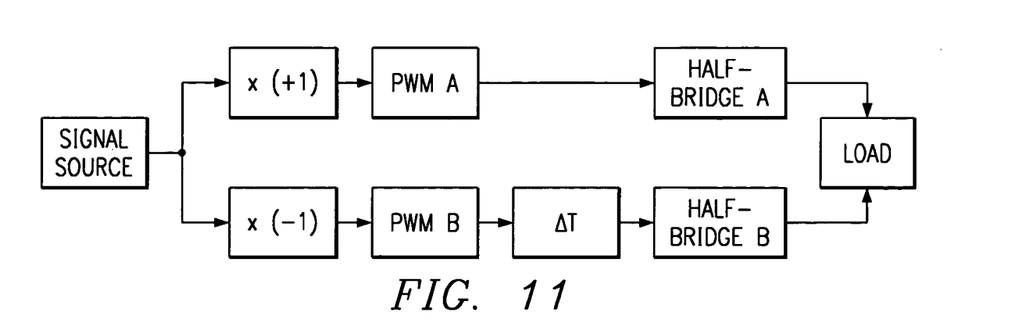

These errors may be corrected by introducing a delay between the inverted and the non-inverted legs of the class BD modulation. Refer to FIG. 11.

Figure 12:
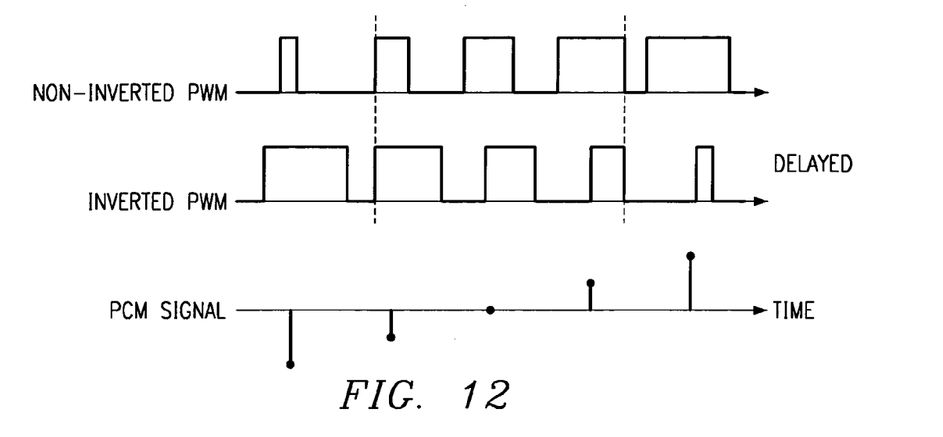

FIG. 12 illustrates the Class ABD waveforms.

By implementing programmable registers in accordance with the present embodiment to accurately control the ABD delay a further improved system tuning can be performed to achieve high performance that is less sensitive to speaker load with very low risks in a cost effective manner and without compromising the amplifier specifications.

Figure 13:
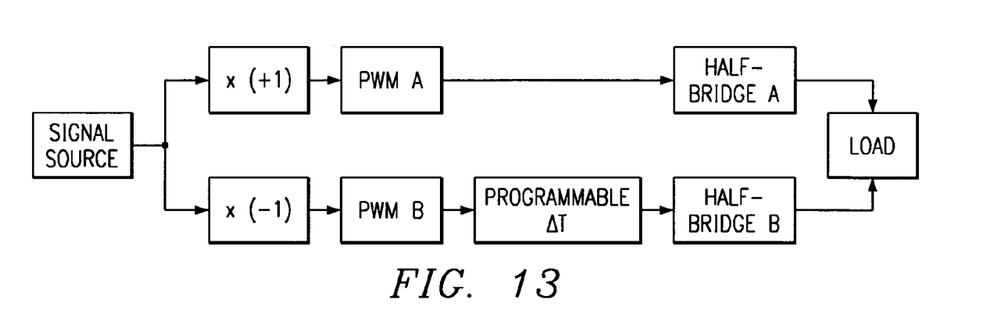

FIG. 13 illustrates an exemplary implementation of the programmable ABD delay. A 5-bit register is used to program 32 different delay values. Each delay value is equivalent to $1/(2048*fs)$ ns for fs less than 50 kHz, and $1/(1024*fs)$ns for fs greater than 50 kHz. This method allows an optimum delay value to be used for the best system performance.

Figure 14:
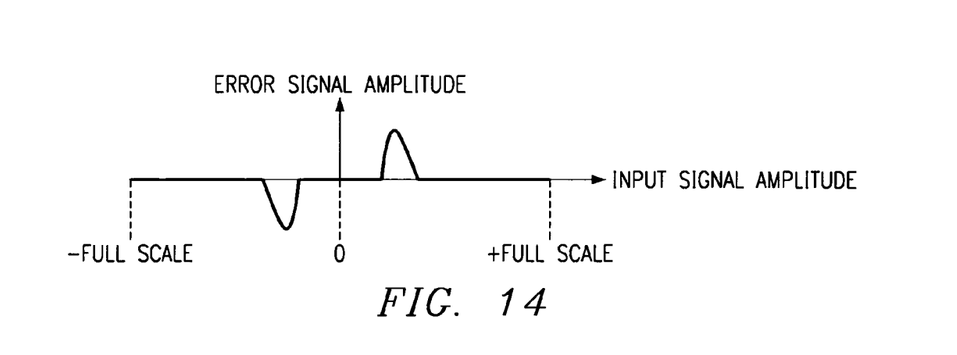

FIG. 14 shows the Class ABD error signal.

Some of the advantages of having a programmable ABD delay are:
choice of delay values available so that a best delay value for a particular system can be programmed to give the best results.
reduced system noise, and a noise floor reduction,
significant improvement in system performance,
reduced switching noise between the inverting and the non-inverting PWM outputs,
reduced zero crossing distortion in an amplifier,
tone rejection and improved EMC,
less sensitivity to the speaker loads and
Temperature insensitivity on the noise floor.

In accordance with a yet further aspect of the present invention there is provided a Programmable Inter-Channel Delay between the Left and the Right Channels for improved system performance, noise floor, inter-modulation distortion and cross talk between the left and the right channels.

The Left and the Right channels are separated by an introduction of a known delay. In the embodiment for example, two dedicated 8-bit registers are used to control the Left and the Right channel delays. Each delay value is equivalent to $1/(2048*fs)$ ns for fs less than 50 kHz, and $1/(1024*fs)$ ns for fs greater than 50 kHz. This allows the user to program 256 different values for both the left and the right channels. An optimum delay value can then be determined by this programmable option to give the best system performance in a cost-effective manner.

Figure 15:
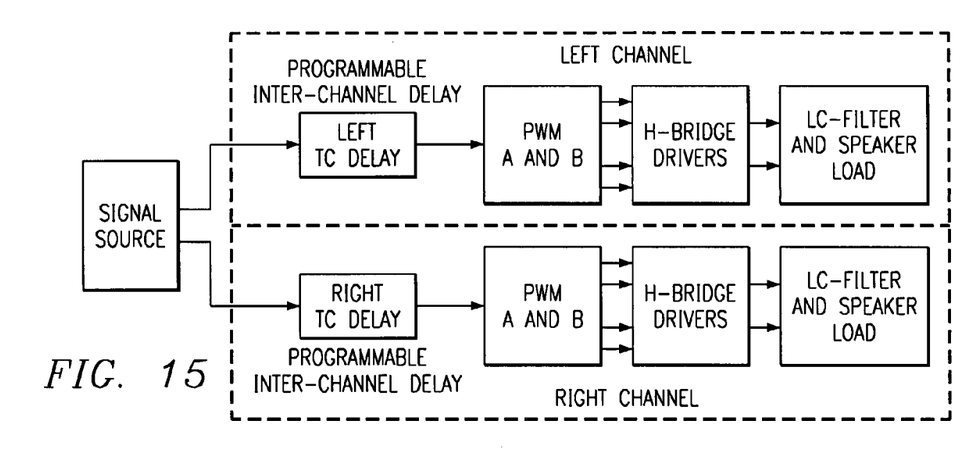

FIG. 15 illustrates the modulation scheme with programmable inter-channel delay.

Figure 16:
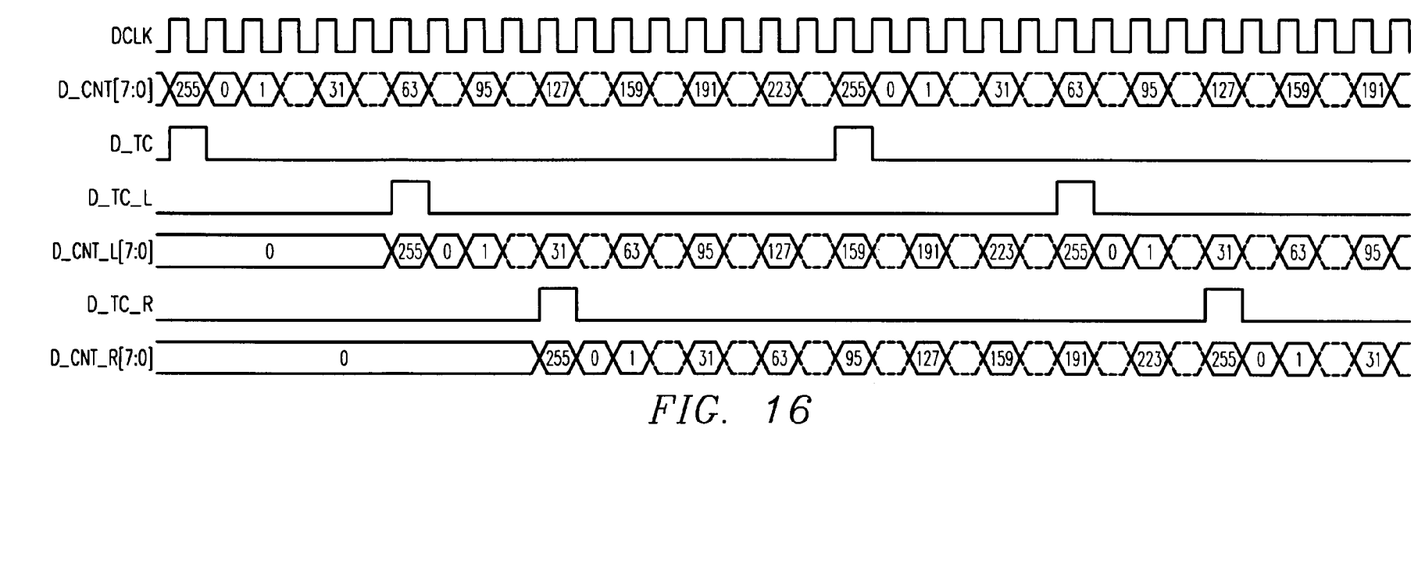

The PWM mapping is implemented using a counter clocked by the fastest clock which is running at the rate of $2048*fs$ for fs less than 50 kHz, and $1024*fs$ for fs greater than 50 kHz, where 'fs' is the input sampling frequency. The input data rate to the PWM mapping blocks occurs at $8*fs$ for fs less than 50 kHz, and $4*fs$ for fs greater than 50 kHz rate. This design style allowed an efficient way to implement the inter-channel delay. FIG. 16 shows the timing diagrams explaining the relationship between the input sample rate and the PWM output and the inter-channel delay.

FIG. 16 illustrates the implementation of the programmable inter-channel delay through registers. Terminal count (TC) represents the start of the reference counter used in the PWM mapping stage. The prefix 'D' in the signal names represent that all signals are synchronous with DCLK, the high speed clock which is used in the PWM mapping stage. D_TC_L and D_TC_R represent the terminal count values for the left and the right channel respectively. D_CNT_L[7:0] and the D_CNT_R[7:0] are the corresponding counter values for the left and the right channel. The start of each counter is programmable through the programmable registers. FIG. 16 shows that both left and right channel start at counter values zero, but they can be programmed to start at any value starting from 0 to 255 depending on the value set in the programmable inter-channel delay register.

Some of the advantages of having a programmable inter-channel delay are:
choice of delay values available so that a best delay value for a particular system can be programmed to give the best results.
reduced system noise, and noise floor reduction
reduced switching noise between the Left and the Right PWM outputs,
power supply tone rejection,
improved EMC,
reduced inter-modulation distortion,
reduced cross-talk between the left and the right channels,
reduced cross-talk in multi-channel systems
significant improvement in system performance, In a digital class-D audio amplification system for example, the way the required PWM data is generated makes it extremely susceptible to noise coupled through the substrate and power supplies as well as through cross-talk. These sources of noise could significantly degrade the performance of these systems for high-end audio applications.

The present embodiment combines many techniques that minimize noise coupling and cross-talk. A high-frequency clock is generated in the internal PLL. This clock is used both to process the incoming data as well as to resynchronize it. Incoming data is processed and generated with the rising edge while output data is resynchronized with the falling edge. Derivations of this high-frequency clock are used in both cases. The falling edge is used mainly because this is when there is little switching activity which results in a reduction of power supply noise, and also because it helps to minimize the requirements for very precise delay matching between the two clocks. In order to reduce substrate noise coupling to the PLL, several guard rings are used around it. The outer ring has been made wider and uniquely connected to a separate bonded pad so that substrate noise is collected and routed to the return ground and away from the sensitive PLL internal circuitry. This entire block has been placed in a corner of the die to minimize perimeter contact with the part of the substrate that is closer to the "noisy" digital core. It has also been placed at a safe distance to further increase substrate isolation. The PLL high-frequency clock output is "coaxially" routed to the reclocker block that is placed on the opposite side of the die. The shield of this coaxial routing is connected to a clean ground. Intermediate buffers are carefully selected and placed to improve delay matching with the corresponding clock tree of the digital core. Enough separation is also maintained at all times between the clock and nearby signals to minimize cross-talk. The last stage of the reclocking clock is routed as a binary tree to balance loading and further minimize skew. A guard ring tied to the main ground is placed around the "noisy" digital core block to collect as much substrate noise as possible and route it away from the reclocking circuitry. The flip-flop of the reclocker and the output buffer are carefully selected so that rise and fall times are equivalent under the same operating conditions. These cells are also symmetrically placed to minimize imbalances. The power supply and ground lines for each flip-flop and each output buffer are separately routed from the corresponding power and ground pads to improve power supply noise isolation. A guard ring tied to a clean ground is placed around each flip-flop of the reclocker to reduce substrate noise coupling. This guard ring is tied to a clean ground return. A unique pair of power supply pins are exclusively used for the reclocker flip-flops for cleaner switching. The power pin is placed adjacent to the ground pin. A unique pair of power supply pins is used for each group of output buffers (one group per channel). Each power pin is placed adjacent to the ground pin. Each one of these pins is also double bonded to reduce parasitic inductance and resistance. The lead frame was carefully selected so that the distance between the die and lead frame bonding pads (bonding wires) were as similar as possible for the critical PWM outputs in order to balance parasitic inductive and resistive effects.

In a digital amplifier the modulator may be implemented in a digital circuit based on clocked logic for example programmable or programmed devices. Typically such circuits will have multiple clock domains. The clocks may be dependent upon each other or separately derived from individual phase locked loops (PLL) or otherwise. Wherever a clock is employed, clock errors and clock losses in Class-D digital amplifiers can be catastrophic to the load, for example the speakers driven by an audio amplifier.

When such errors happen, the H-bridge outputs may stick in some unknown static state (due to loss of clocking). This causes huge DC currents to flow through the speaker load, which causes damage to the speakers and the H-bridge switching devices.

To prevent these catastrophic errors several error detection and protection circuit regimes are employed in the present embodiment.

The embodiment operates with four clock domains. Any errors in anyone of these clocks can be detrimental to the system, affecting both the performance and reliability or even causing catastrophic failure.

The types of errors possible in such an arrangement include:
No Clock I
No clock II
No Clock III
No Clock IV
A combination of clock losses
Clock phase errors, e.g. an incorrect number of pulses in a composite period or sampling period
PLL Break-Lock (tracking between Clock I and Clock II)
Data synchronization errors between Clock I and Clock II domains
Asynchronous control pin changes In accordance with the present invention, errors of the above type are detected by implementing counter-based circuits. A hierarchical approach is adopted in this approach, counters are provided, such that the highest speed clock counts the number of pulses in some multiples of the slowest clocks periods.

Then the highest speed clock is divided down to some multiples of the slowest clock periods. Then the slowest clocks are used to count the number of pulses in the divided down faster clocks.

Then a comparison is made among the corresponding counted pulses. An error is indicated if the counted values does not match within a certain window. This window is dictated by the clocking schemes used and the data synchronization between clock domains so that there is no loss of information within that range.

When any of the control pins change state on the fly when the system is in operation, means are provided to detect the logic state changes of the pins by using some edge detect circuits on those pins. This change is then indicated to the system controller or control circuit of the overall modulator arrangement which forces the digital amplifier or PWM outputs to a Mute or no signal state and initiates a system re-initialization so that correct operation may be re-gained. The PWM outputs will resume its normal state once the initialization is complete, by first outputting a 50% duty cycle (soft mute state) for few composite periods before sending out the actual data to resume full operation. This ensures a smooth wake-up of the H-bridge switches without any audible artifacts.

Once an error is detected it can be sent to a status register for example an 8-bit register. Each bit represents a different type of error. The user can read this error register for example through an I²C or SPI interface.

This approach may be extended to ensure that all possible clock errors are covered.

There may be a remaining potential problem if all the clocks disappear at the same time such as for example when operating in a slave mode, where all the clocks are inputs to the system rather than internally derived. When this occurs the PWM outputs from the modulator may become stuck in some static state causing a large DC current flow through the speaker or other load causing damage to the speakers and the H-bridge switches.

The exemplary activity detector described herein monitors the H-bridge's input PWM signals and or clock signal to the modulator and in the case of clock loss, it provides a logic signal to the control circuit which may be used to shut down the H-Bridge promptly, for example as described above. The muting may be retained while the error persists and the device restarted as described above or otherwise.

Figure 17:
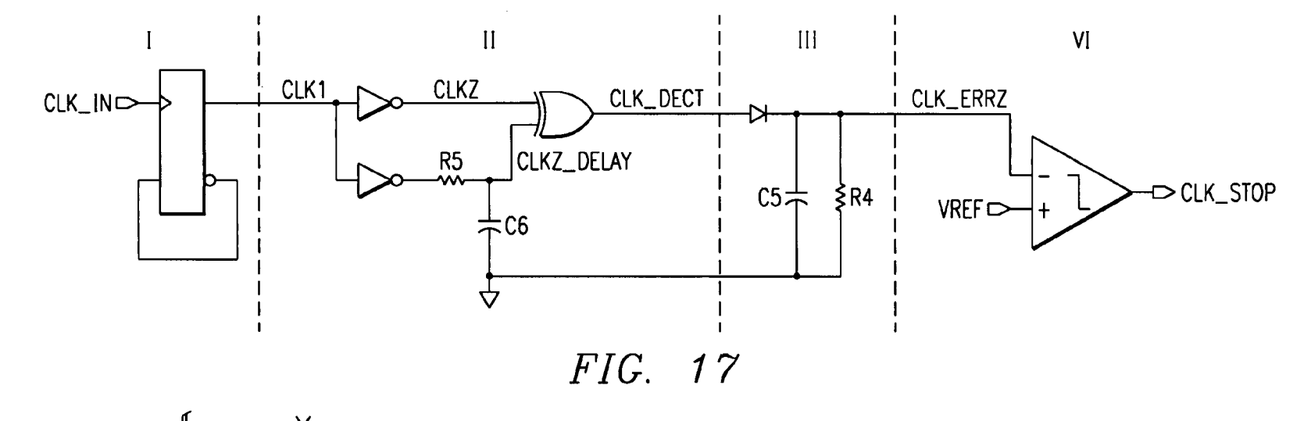

An activity detector is shown in FIG. 17 and may be considered in four stages.

Stage 1, Re-clocking stage, comprises a T' flip-flop. It functions as a frequency divider. The digital amplifier includes a clock modulator and clock activity is monitored by counting divided multiples of the clock. The main advantage of this approach is the output CLK1 will approximately become a 50% duty cycle waveform for a pulse train of the input at CLK_IN ranging from 7% to 93% duty cycle.

Stage 2, Differentiating stage. Inverts the CLK1 input and provides an output CLKZ and an output CLKZ_DELAY with an extra (e.g., 250 ns) delay through RC network to the inputs of an XOR. The output CLK_DECT will be the pulse waveform with ~250 ns width with clock input at CLK_IN. If the input CLK stops (becomes DC static), CLKZ and CLKZ_DELAY become the inverted DC static and CLK_DECT will be a DC zero. Preferably, the final stage of XOR should have a strong driving capacity.

Stage 3, Rectifying stage, converts the pulse waveform to analog DC output. With an active clock, the pulse waveform at CLK_DECT will constantly charge the C5 rapidly and increase the voltage at node CLK_ERRZ. If there is a clock loss, Capacitor C5 will be discharged with timing constant of C5×R4 (e.g., 17.5 us) and results in a voltage decrease on the CLK_ERRZ signal. The C5×R4 will determine the length of time that a loss of clock could be tolerated without an error being triggered.

Stage 4, Comparator stage, will compare the sensing voltage CLK_ERRZ to a temperature independent voltage VREFP (e.g., 0.25V) and outputs an active low control signal (CLK_STOP) if the clock becomes inactive. This can be used to derive the control signal referred to above.

Dead time control plays a very important role in the digital Class-D amplifier to achieve good performance in THD and Noise. In a Class-D H-Bridge, dead time is defined as the time gap between one switch in the half bridge turning off and the other switch turning on. Too small a dead time will result in high current shoot-through for both the high and the low switches during the transition time. This will cause the output noise floor to rise, it will lower power efficiency, and may potentially cause damage to the half bridge switches. Large dead times will cause higher distortion (THD). Hence the best overall performance for a particular application may be achieved with well-matched and reasonable value dead times on both the low to high transitions and the high to low transitions.

In the present embodiment a dead time circuit provides a wide range of linear controlled dead time with good matching on the low to high and high to low transitions. Preferably, the actual dead time is determined by either an on chip resistor (where the circuit is fully integrated) or an external resistor that can track the actual gate charge of the H-bridge switches (which may for example be DMOS switches). In accordance with a further aspect of the embodiment, a circuit is provided which is flexible to give either temperature independent or compensated dead time as required by the different applications.

Figure 18:
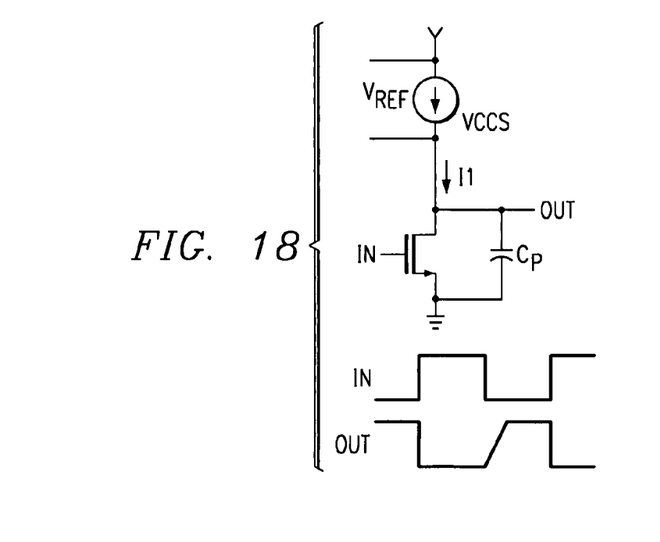

As shown on FIG. 18, a circuit which provides a fast-on/slow-off switching which gives an extra controllable delay to rising or falling edge but not both. Voltage Control Current Source(VCCS) provides biasing current I1 to the NMOS switch. There is a Capacitor Cp connected between the circuit output OUT and GND.

When the input IN is changing from high to low, the NMOS switch will shut off quickly. The capacitor Cp will be charged up by I1 with the time constant of $$\tau = \frac{Vdd \cdot Cp}{I1} \qquad 1$$

until Cp reaches saturation. Where the Vdd is the Constant Supply to the switch, for example 3.3V. So the output OUT will have a rising slope equal to length τ.

When the input IN changes from low to high, the NMOS switch will turn on and provide the path for current flow for I1 to discharge the capacitor Cp. The switch will stay at low impedance while input IN signal is high, so the actual discharge time for Cp is much smaller than the charge time. The fast falling slope is expected at the output OUT.

The waveforms for IN and OUT are also shown in FIG. 18. If IN comes from an inverted IN1 through an inverter and the waveform OUT goes further through a standard gate buffer with the threshold voltage Vt, A new waveform OUT1 is generated which inherits shape of IN1 but adding extra delay Dt to the rising edge.

$$Dt = \frac{V\_t}{Vdd} \cdot \tau \qquad 2$$

Substitute 1 to 2, comes $$Dt = \frac{V\_t \cdot Cp}{I1} \qquad 3$$

Dt is controlled by Vdd, Cp and I1 as shown on equation 3. It is exactly the low to high (Rising) dead time as defined.

In the embodiment described, the threshold voltage for the standard gates could be considered constant (close to ½ Vdd) for a fixed power supply voltage. I1 and Cp becomes the parameters in controlling the dead time.

I1 will be generated from the Voltage Control Current Source (VCCS) with the input of Vref. The detailed circuit structure can be found in FIG. 19.

Figure 19:
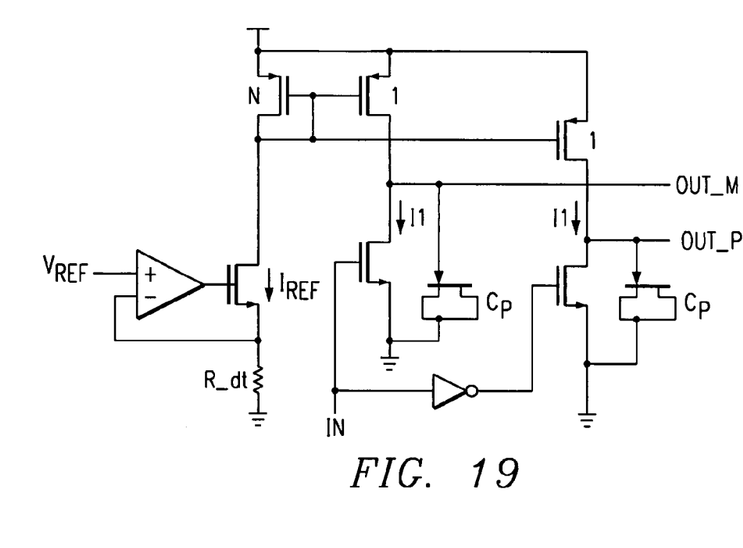

In FIG. 19, I1 takes the one Nth division of the Iref through the current mirror and Iref is controlled by Vref and R_dt.

$$I1 = \frac{Vref}{R\_dt \cdot N} \qquad 4$$

From (3) and (4), comes $$t\_{DEADTIME} = \frac{V\_t \cdot Cp \cdot R\_dt \cdot N}{Vref} \qquad 5$$

As shown on equation 5, dead time $t\_{DEADTIME}$ is proportional to R_dt. R_dt becomes the only controllable parameter if the Cp and Vref are fixed. The threshold voltage Vt is fairly constant for standard gate for a fixed power supply voltage.

For the pulse wave input, the output OUT_M and OUT_P become the negative and positive waveform pair of IN with the added dead time. OUT_M and OUT_P will further be applied to the low side and high side gate drive blocks respectively to drive the low side and high side H-Bridge switch devices.

Gate tied switch device(DMOS) in proportion to the size of the H-Bridge switches may be used as the capacitor Cp. An advantage of doing this is the dead time will track the actual gate charge of the switching output H-bridge device (gate charge will vary due to process variations and temperature changes). The dead time will be adaptive to actual load conditions at the gates of the H-Bridge's output devices.

In the arrangement described, R_dt is the primary parameter in control of the dead time. For the temperature independent dead time, small temperature coefficient resistor or resistor combinations may be used. For extra temperature compensation, a negative temperature coefficient resistor may be used. For extremely accurate absolute value dead time control, a high precision resistor may be used for example as a discrete or external component. Integrated resistors may also be used.

Vref could be a Bandgap reference so that the dead time can be temperature independent. For extra temperature compensation, Vref could also be the temperature dependent source, like VPTAT. (Voltage Proportional to Absolute Temperature).

As previously stated, the present embodiment is less susceptible to power supply noise than prior art designs, therefore the power supply can be simpler and lower cost. With regard to the H-bridge itself and in accordance with a yet further aspect of the invention there is provided means for reducing the effect of peak or spike voltages from the power supply. In particular, power H-bridges often are used with some form of an EMI Power Supply filter. However depending on the design of the EMI Power Supply Filter, it can provide spikes on the Power Supply line input to Power DMOS during high current switching. This spike voltage can potentially limit the system delivery power to the load since the Peak Voltage supplied to the H-bridge is the Power Supply Voltage+Spike Voltage. In the embodiment, (see FIG. 20) there is a Clamp Diode provided across the Power Supply EMI filter Inductor to limit the peak spike voltage on the power supply lines. The Safe Operating Area of the H-Bridge output switches limit the Peak Voltage supplied to the DMOS transistor in a given CMOS process; by these means from a performance viewpoint, the area of the output switching device is effectively extended. The use of a Power diode on a Power Supply Snubber reduces the spike energy delivered to the device, which allows the DMOS transistor to operate with a Higher Power Supply voltage and a Higher Actual Power is delivered to the load (for a given breakdown voltage of a DMOS transistor).

Higher Power can be reliably delivered to the load for a given transistor's breakdown voltage. Cost reduction of the large Output DMOS transistor occurs due to lower area needed for lower voltage transistors with equal Rds(on) requirements. Die area reduction comes from the lower area of the output transistor as well as it's gate driver circuitry. Power Efficiency can be positively impacted, since less gate charge is required to turn-on each DMOS Power transistor given lower gate areas.

Figures 20, 21:
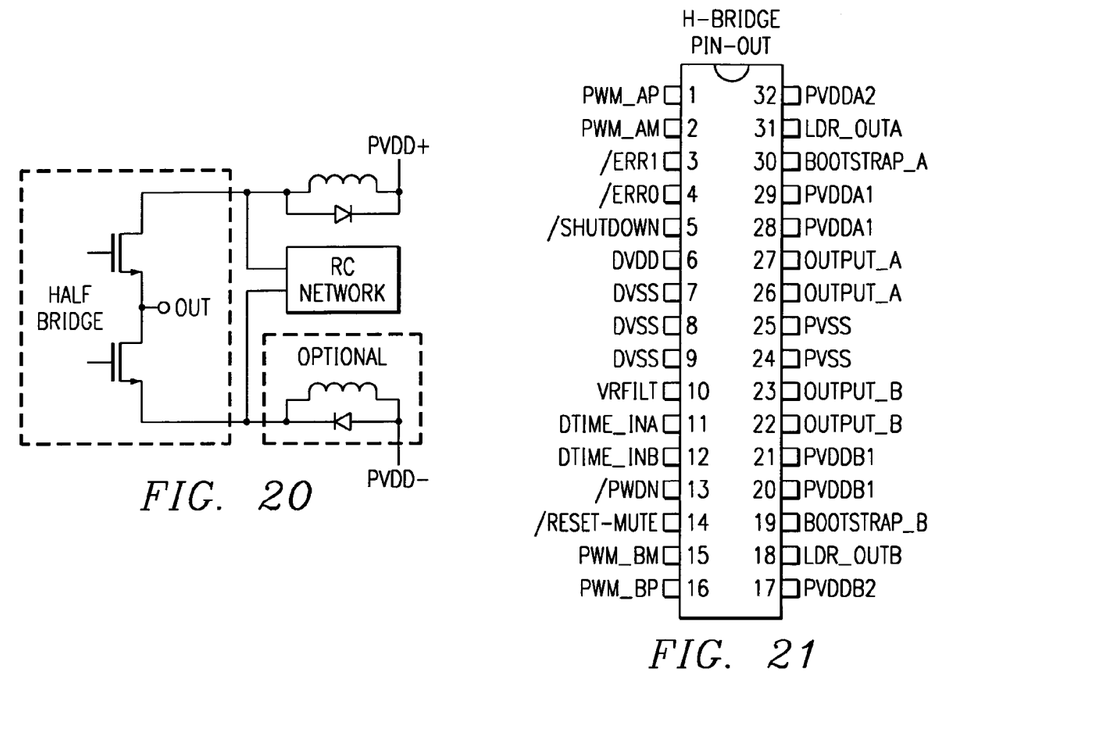

As shown in FIG. 20, a diode is included in the positive supply leg. Another diode may be optionally included in the negative or ground return leg. The H-bridge drive components have been integrated into a single device and features of this device form part of the present invention.

Layout of H-Bridge Pin Assignments in the Power H-Bridge, combined with compact Printed Wiring Board (PWB) Layout reduces parasitic inductance, capacitance, and High Current Loop areas. This reduces EMI transmission while improving transient performance, and reducing any ringing of H-Bridge Output waveforms that create EMI. Symmetrical designs on pin-out of the die layout and PCB layouts for two half H-Bridge provides good matches on electrical characteristic.

As may be seen from FIG. 21, the device pinout is a symmetrical design of 2 half H-bridges that allows matching of performance for each Half H-Bridge. The Pinout includes Power Supplies and Ground, Bootstrap Capacitor connection for the High Side Driver of each Half H-bridge, and output for each half H-Bridge. The symmetrical design allows virtually identical performance for the two Half H-Bridges. This results in lower noise, and lower THD (Total Harmonic Distortion). The H-Bridge PWB layout is very compact reducing parasitic inductance, capacitance, and High Current loop Areas.

In accordance with a yet further aspect of the present invention, current protection is applied to the embodiment.

In the embodiment an Over-Current circuit protects load and H-Bridge switch devices in case that a short circuit condition occurs. The short circuit can happen anywhere between (1) the Output of the one half bridge to the other, (2) output to the H-Bridge power supply, (3) output to ground, etc. The low side Over-Current Protection can only give protection to conditions (1) and (2). A high side Over-Current protection will cover the case (3) but prior art has required tremendous complexity in the circuit design.

Figure 22:
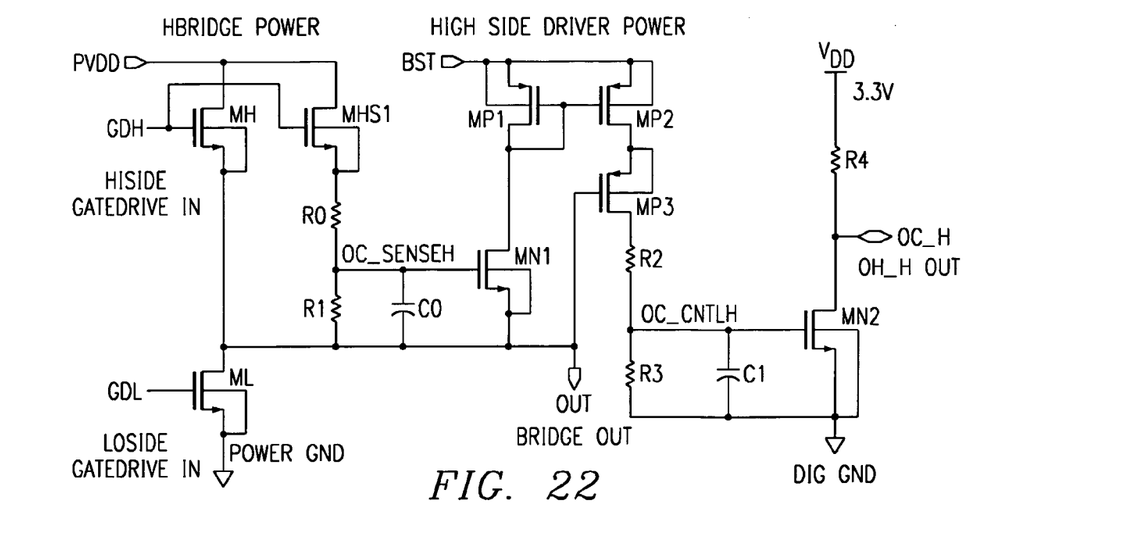

The embodiment includes a new high side Over-Current protection circuit with good reliability to give adequate protection over (3) while simple in circuit design (FIG. 22).

As shown, MH and ML are the half Bridge switch devices (DMOS) powered by PVDD. GDH and GDL are the gate driver signals from the high and low side driver blocks (not shown). If there is short current through the MH, the voltage drop across the MH (V_dson) will be much higher if we assume the Rds_on for the DMOS is constant. MHS1, R0, R1 and C0 form the sample and deglitch circuitry to scale the V_dson voltage and to filter out the high frequency spikes. For Bootstrap and charge pump high side driver supplies, R0 and R1 are chosen to be above the Rds_on of MHS1 to eliminate the error (normally a resistance value in the Kohm range meets the requirement). The ratio of R1 to R0 determines the ratio of OC_SENSEH to V_dson, which determines the trip current value setting of the circuit. An alternative second approach may be applied to bootstrap high side supply. Replace the R0, R1 with DMOS MHS2 and MHS3 which are the same type and size device as MHS1 and tie the gates of MHS2 and MHS3 to bootstrap voltage (Same voltage potential as MHS1 gate when it is on). The node between MHS3 and MHS2 will provide ⅓ of V_dson and the node between MHS2 and MHS3 will provide ⅔ of V_dson.

The OC_SENSEH will control the gate of MN1, if the OC_SENSEH is higher than Vt of MN1, the MN1 will turn on and there will be current flow through MP1 and MN1 instantaneously. Through the current mirror supplied by high side gate driver block (e.g., bootstrap supply), the mirrored current will flow through MP2, MP3, R2 and R3 to low voltage digital ground. MP3 is optional and is only needed for high voltage application where supplying voltage to the current mirror device exceeds the maximum voltage of VGS, VGD on that device (e.g. MP2). Ratio of R3 and R2 plus C1 scale down the control voltage on OC_CNTLH and filter out the high frequency spikes.

The OC_CNTLH will control the gate of MN2 and generate the 3.3V active low control signal OC_H if it is greater than Vt. (e.g., ~0.7V). The OC_H signal is sent to the control block. When OC_H is active, the (GDH, GDL) signals are set to quickly shutdown the H-Bridge.

In General, Ratio of R1 to R0, R3 to R2 will adjust the trip current of the circuit depending on the designed Rds_on of the MH and ML, Vt of MN1 and MN2. R0XC0, R2XC1 will determine the sensitivity of the control and the response time. For general short protection, the trip current could tolerate a relative wide range, e.g. 6 amps to 10 amps, these components could be easily tuned to meet the specified requirement.

In summary, the above circuitry provides good solution for high side H-Bridge short protection. It is simple and easy to implement. It gives good isolation between power (H-Bridge) ground and digital ground (low voltage).

The invention claimed is:

1. A digital amplifier including a clocked modulator wherein clock activity is monitored by counting divided multiples of the clock,
wherein when a clocking error is detected, a parameter indicative of the error is stored.

2. A digital amplifier as claimed in claim 1 and including multiple clocks and wherein a first clock is used to count a second clock.

3. A digital amplifier as claimed in claim 2 and wherein a divided multiple of said second clock is counted.

4. A digital amplifier as claimed in claim 2 and wherein output is disabled when a clocking error is detected.

* * * * *